(12) United States Patent
Sherry

(10) Patent No.: US 6,351,374 B1
(45) Date of Patent: Feb. 26, 2002

(54) REMOVABLE HARD DISK DRIVE MODULE

(76) Inventor: Raymond C. Sherry, 4221 Saint Leger Dr., Cleburne, TX (US) 76031

( * ) Notice: Subject to any disclaimer, the term of this patent is extended or adjusted under 35 U.S.C. 154(b) by 0 days.

(21) Appl. No.: 09/042,088

(22) Filed: Mar. 13, 1998

Related U.S. Application Data

(62) Division of application No. 08/697,066, filed on Aug. 19, 1996, now Pat. No. 5,757,617.

(51) Int. Cl.[7] .............................. G06F 1/16; H05K 7/10
(52) U.S. Cl. ........................................ 361/685; 361/730
(58) Field of Search .................... 361/684, 685, 361/686, 728, 730, 737

(56) References Cited

U.S. PATENT DOCUMENTS

| | | | |
|---|---|---|---|
| 4,652,969 A | 3/1987 | Stegenga | 361/694 |
| 4,941,841 A * | 7/1990 | Darden et al. | 439/377 |
| 5,041,924 A * | 8/1991 | Blackborow et al. | 360/69 |
| 5,187,643 A * | 2/1993 | I-Shou | 361/685 |
| 5,235,493 A | 8/1993 | Yu | 361/685 |
| 5,260,852 A * | 11/1993 | Ma | 361/685 |
| 5,311,455 A * | 5/1994 | Ho | 361/685 |
| 5,406,450 A * | 4/1995 | Shieh | 361/686 |
| 5,652,695 A * | 7/1997 | Schmitt | 361/685 |
| 5,737,185 A * | 4/1998 | Morrison et al. | 361/685 |
| 6,018,778 A * | 1/2000 | Stolowitz | 710/61 |

* cited by examiner

*Primary Examiner*—Lynn D. Feild
(74) *Attorney, Agent, or Firm*—Chauza & Handley, L.L.P.

(57) ABSTRACT

A hard disk drive module packaged so as to be insertable and removable into a chassis by a user. The hard disk drive module is housed within a connectorized housing, including interface circuits on a printed circuit board, all of which is pluggable into a computer chassis, or the like.

16 Claims, 8 Drawing Sheets

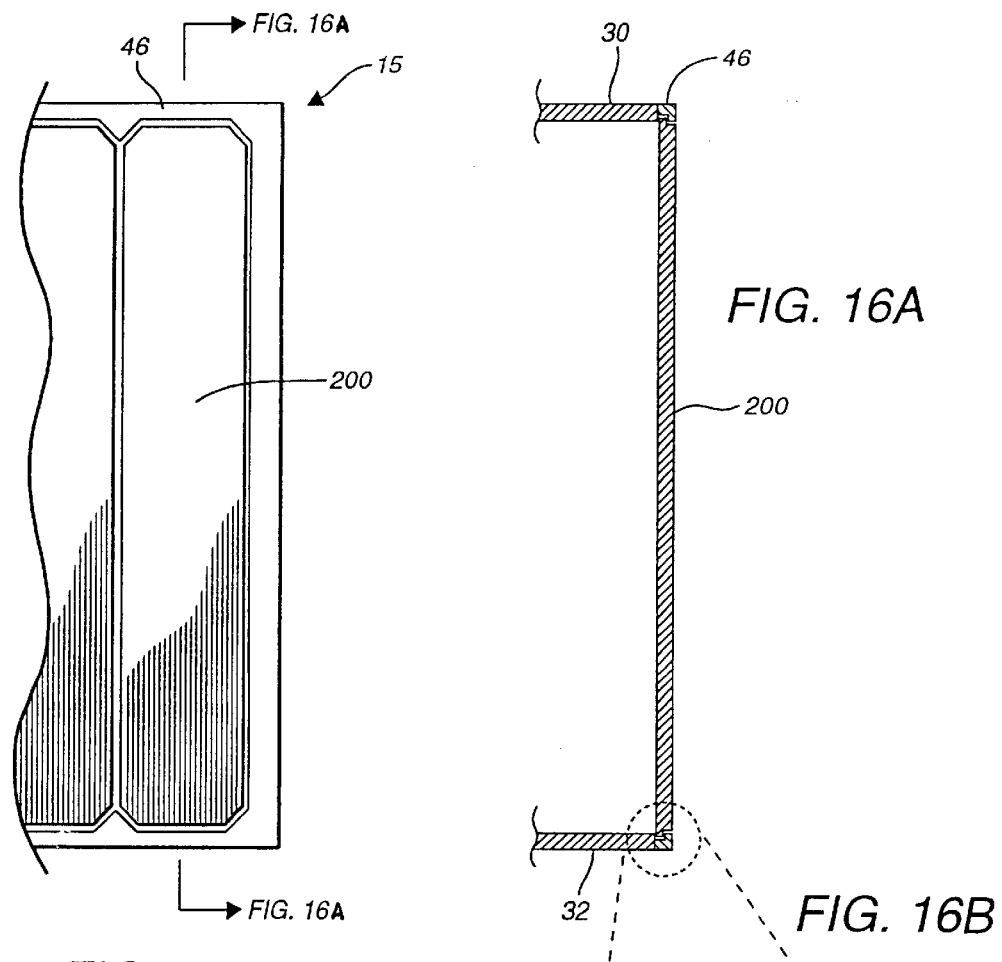
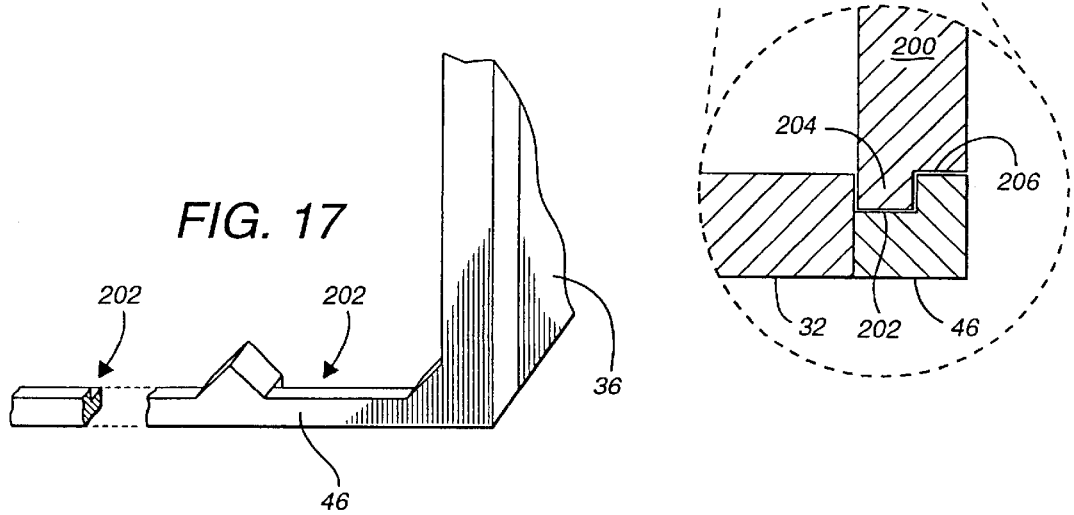
FIG. 15
FIG. 16A
FIG. 16B
FIG. 17

REMOVABLE HARD DISK DRIVE MODULE

This application is a division of Ser. No. 08/697,066, filed Aug. 19, 1996, U.S. Pat. No. 5,757,617.

TECHNICAL FIELD OF THE INVENTION

The present invention relates in general to the compact integration of circuit modules in a chassis, and more particularly to a technique for providing a high density interconnection between multi-pin circuit modules, by way of a high density conductor chassis backplane.

BACKGROUND OF THE INVENTION

Constant efforts are directed toward the miniaturization of electrical circuits and components to thereby increase the circuit density per unit area. The integrated circuit technology has made significant advances in the development of the semiconductor layout, masking equipment, steppers, etc., to thereby form a greater number of transistor circuits onto a smaller area of the semiconductor material. Further, the miniaturization of components and the hybridization thereof into encapsulated modules is an ongoing endeavor toward the miniaturization of electrical circuits. Advantage is taken of the smaller size of the components, encapsulated modules, integrated circuits, etc., by allowing many more of such components to be interconnected on a printed circuit board. Indeed, printed circuit boards themselves have multiple layers of conductors, as well as high density conductors to thereby facilitate the interconnection of the many components mounted thereto.

Notwithstanding the ongoing miniaturization of components, such components are still required to be interconnected together not only by way of the printed circuit boards noted above, but such printed circuit boards, or modules, are also often interconnected together in a chassis. A common technique for housing a number of printed circuit modules is to provide metallic contacts on one or both opposing edge surfaces of the printed circuit board, and a corresponding female connector mounted in the chassis. In this manner, when the printed circuit board is inserted into the chassis by way of guide rails, the edge conductors automatically mate with corresponding connector contacts. Moreover, the connectors are interconnected with other connectors by wires that are often manually or automatically wound around terminals extending from the connector. Instead of the hard wired interconnections between chassis connectors, a multi-layer backplanes are often utilized to provide the interconnections between the connectors. In this instance, the connector terminals are soldered into the backplane conductors. Although this printed circuit board backplane is relatively expensive, it reduces the time required to assemble a complete chassis and connector interconnections.

While the foregoing chassis assembly functions very well for its intended purpose, a problem arises when it is desired to increase the number of connections between the printed circuit modules and the connectors. One approach has been to simply extend the length of the printed circuit board edge to accommodate more contacts, but this solution requires a larger connector and chassis. Another technique is to mount a separate, small printed wire board to the printed circuit board, but spaced therefrom, with wiring interconnecting the two, so that a pair of edge connectors can be utilized for the circuit module. Yet another approach has simply been to reduce the size and spacing between the edge contacts of a printed circuit board, thereby increasing the density of the contacts. This technique can be utilized to the extent that the contact surface area is reduced until inadequate metallic contact area exists to carry the requisite electric current.

While the utilization of printed circuit boards with components soldered thereto has experienced a significant success, inherent disadvantages still exist. For example, the components extending from the printed circuit board are subject to damage especially when stacked or inventoried together, without packing material therebetween. Further, the physical handling of such circuit boards when inserting or removing the same from the chassis, subjects the exposed components to damage or short circuiting with other components.

It can be seen from the foregoing that a need exists for an improved printed circuit module design that provides protection to the components thereof from the environment, as well as provides a high degree of interconnectivity to a backplane. A further need exists for a technique to provide self-alignment of high density pins/sockets between a printed circuit module and a backplane to thereby prevent bending or misalignment of the respective pins and sockets. Yet another need exists for an interconnection technique between a high density socket of the printed circuit module, and a corresponding high density pin arrangement of a backplane, while yet maintaining the assembly procedure relatively uncomplicated and maintaining a high degree of reliability.

SUMMARY OF THE INVENTION

In accordance with the principles and concepts of the present invention, there is disclosed a chassis assembly that provides a high degree of interconnectability between the printed circuit modules by way of a high density conductor backplane. In accordance with other aspects of the invention, the printed circuit modules are enclosed so as to protect the components from physical damage, while yet allowing easy accessability to the components when adjustment or repair is required. Further, the particular sliding engagement employed between the printed circuit modules and the chassis guide rails provide a high degree of alignment between the high density pins and sockets.

In accordance with the preferred embodiment of the invention, a module case provides physical protection to one or more printed circuit boards housed therein. Each printed circuit board has a back edge thereof with miniature socket contacts soldered to corresponding pads on each side thereof, thereby providing a high density of interconnections to corresponding miniature pin contacts in a chassis backplane. The socket members of each printed circuit board are maintained aligned and housed within an insulator board to thereby prevent physical damage or misalignment of the individual sockets. The protective case of each multi-board module is preferably formed of a metallic material to provide a high degree of heat transfer from the module to the chassis via the guide rails. Further, each protective case is formed so as to have one vertical metallic side thereof removable, thereby exposing the components for repair or adjustment. The side cover of the case is removably attached by way of a snap-lock arrangement. A faceplate portion of the case includes a hinged pull-tab to allow easy removal of the module from the chassis. The module is retained in the chassis by way of the sliding friction contact between the miniature pins and sockets.

The protective case that houses one or more printed circuit boards, or other types of electronic assemblies, is preferably pocket-sized for easy transporting of the same.

Further, each case does not have four right angle corners for sliding into the chassis rails, but rather has beveled or chamfered corner edges, each of which engages by way of a small-area rounded guide edge of the chassis. In this manner, the module is aligned or registered by way of these four contact surfaces to thereby provide a high degree of alignment between the module socket contacts and the backplane pin contacts. Further, the sliding surfaces are anodized to facilitate the sliding action between the module case and the chassis guide rails.

According to another feature of the invention, the chassis is provided with a number of module openings which need not accommodate a module but rather may have snap fit therein a blank faceplate. The blank faceplate provides a decorative cover to an unused slot opening, and prevents dust and particles from easily entering the chassis. Another feature of the invention is that the blank faceplate can be constructed with a hinged cover member fastened to the back side thereof, and spring loaded so that when the blank faceplate is snap locked into the slot opening, the hinged cover pivots internal to the chassis to provide a cover to an adjacent slot opening. When the adjacent slot has inserted therein a module case, the spring loaded cover is pivoted out of the path of the module as it is inserted into the adjacent slot opening. When the module case is removed, the hinged cover returns to a position in which the slot opening is covered.

BRIEF DESCRIPTION OF THE DRAWINGS

Further features and advantages will become more apparent from the following and more particular description of the preferred and other embodiments of the invention, as illustrated in the accompanying drawings in which like reference characters generally refer to the same elements or parts throughout the views, and in which:

FIG. 15 is a partial frontal view of a chassis slot opening with a protective blank faceplate snap locked therein;

FIG. 16a and 16b are, respectively, a partial sectional view, taken along line 16a—16a of FIG. 15, showing the snap lock engagement and an enlargement thereof, of the blank faceplate;

FIG. 17 is a perspective view of a portion of the chassis bezel illustrating the cut-out area;

DETAILED DESCRIPTION OF THE INVENTION

Figure 1:
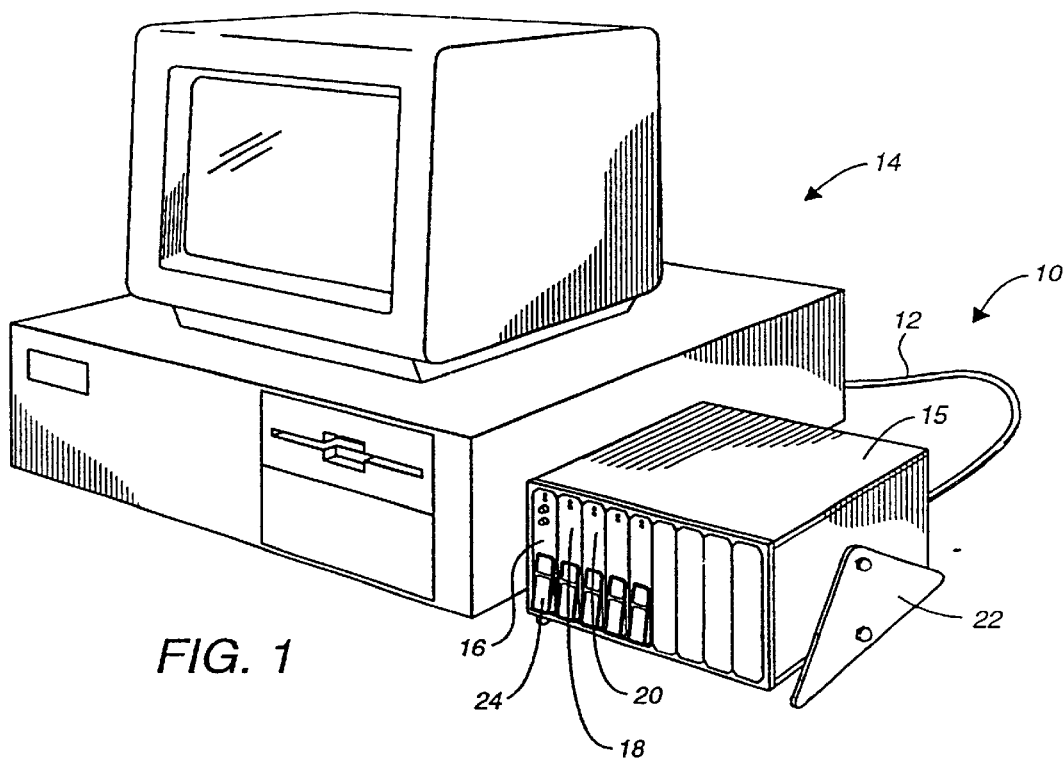
FIG. 1 is an isometric view of a desk top chassis assembly operating in conjunction with a personal computer.

With reference now to the drawings, there is shown in FIG. 1 the chassis assembly 10 electrically connected by an electrical cable 12 to a personal computer 14. In the preferred embodiment of the invention, the chassis assembly 10 functions as a hard disk drive replacement for the personal computer 14. As such, the chassis assembly 10 includes a number of modules, one being a controller module 16, and others being hard disk drive modules, such as 18 and 20. The other modules populating the chassis 15 may be yet other hard disk drive modules, or other circuit board assemblies having circuits mounted thereto for carrying out particular functions. In the preferred embodiment, the hard disk drive module 18 functions as a main hard disk drive, while the disk drive module 20 serves as a mirror disk drive to mirror or back up the data written to the main disk drive 18. When embodied in the illustrated form, either the main or mirror hard drives are removable by the computer user. This portability and compactness of the units facilitates the archival storage of data, or simply the portability of a large amount of data from an office computer to a home computer. The controller module 16 functions to communicate with the personal computer 14 via the cable 12 which includes a small computer system interface (SCSI) bus for communicating disk drive commands between the personal computer 14 and the controller module 16. The controller module 16 includes a digital signal processor that is programmed to provide a continuous backup of data to the mirror disk drive 20.

The chassis 15 of the assembly includes optional support stands 22 for supporting the chassis 15 at a slight angle above a desk or table top. The support stands 22 are fastened to the sides of the chassis 15 by way of small screws. Each module, such as module 16, is removable from the chassis 15 by way of a hinged pull-tab 24 for easy removal and replacement of the module with respect to the chassis 15.

While the foregoing illustrates the invention employed as a hard disk drive replacement for a personal computer 14, the invention is not limited to such an application. The modules 16 can house any type of electrical circuits or components to provide any function whatsoever as a stand-alone unit, or for operation in conjunction with a host or slave system. Moreover, the general configuration of the chassis assembly 10 can be other than that shown in the drawings, such as being dimensioned to accommodate more modules or different sized modules, or be integrated within other electrical hardware, such as within the personal computer 14 itself. Further, the chassis assembly 10 can be further adapted for being rack mounted in a bay of other electrical equipment.

Figure 2:
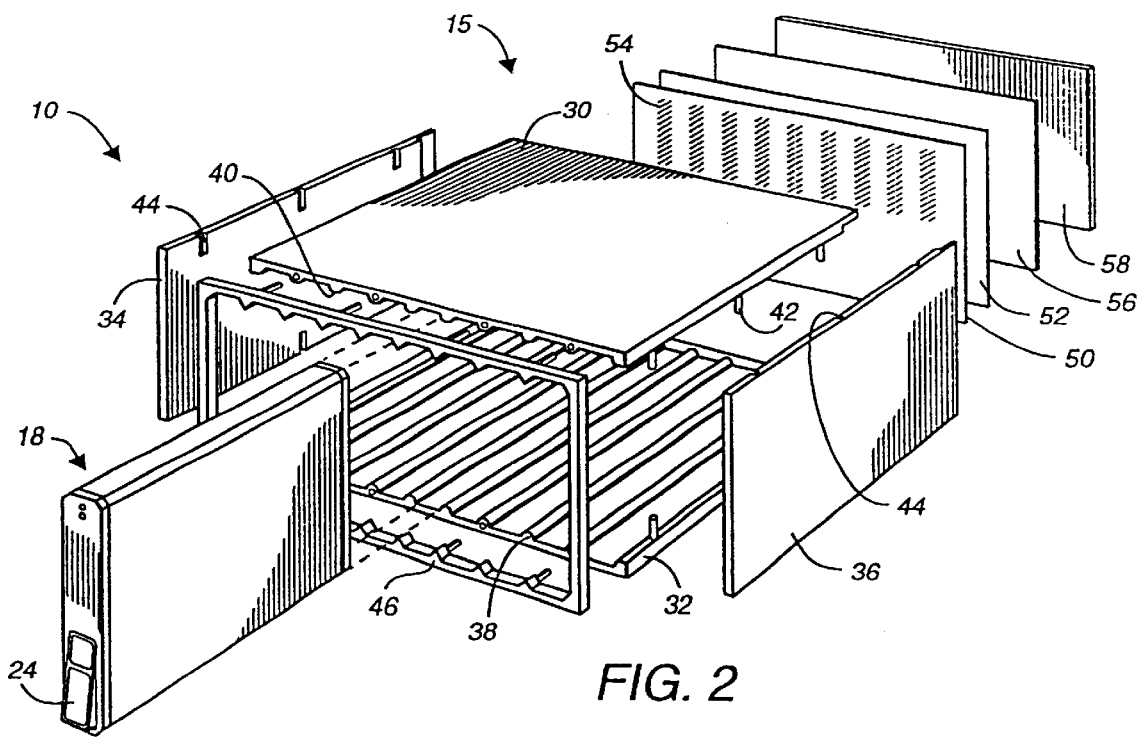
FIG. 2 is an isometric view of the various components of the chassis, with the parts shown in exploded form, and with a circuit module case shown insertable therein.

With reference to FIG. 2, there is shown the basic component parts of the chassis assembly 10 according to the preferred embodiment of the invention. A replaceable module 18 is shown in isometric form, as it is about to be inserted into the chassis 15. The components of the chassis 15 include a top panel 30, a bottom panel 32 and two side panels 34 and 36. The various panels of the chassis 15 are constructed of aluminum, machined to form the various shapes. More particularly, a number of machined guide rails, such as shown by reference character 38 are machined into the bottom chassis panel 32 to provide registration of the module 18 therein. Similarly, a number of guide rails 40 are machined into the top chassis panel 30 to provide a similar function with respect to the module 18. The engagement of each guide rail 38 or 40 with a surface of the module 18 provides both a precise vertical and horizontal registration of the module 18 within the chassis 15. The details of the accurate alignment or registration of the module 18 within the chassis 15 are described in more detail below.

A number of holes are drilled in the top and bottom chassis panels 30 and 32 for insertion therein of corresponding steel split pins 42. Each side panel has corresponding holes or slots 44 formed therein to receive an associated split pin 42. The split pins 42 fit within the respective holes of the top and bottom panels 30 and 32, as well as the side panels 34 and 36 by a compression clearance fit. With this arrangement, a rigid and easily constructed chassis is provided. In a similar manner, a decorative bezel 46 is fastened to the front edge opening of the chassis by way of the split pins and holes described above. The front bezel 46 does not provide any accurate alignment function of the module 18 with respect to the chassis 15.

Mounted to the back of the top, bottom and side panels of the chassis are two boards 50 and 52 which form a backplane for the interconnectivity of the various modules 16–20. The spacer board SO is appropriately populated with a number of miniature pin contacts 54 corresponding to the position of miniature socket contacts of the module 18. The spacer board 50, according to the preferred embodiment of the invention is about 5⅝ inches wide, 3 5/16 inches high, includes room for six vertical rows of holes, with sixty-two holes per vertical row, totaling three hundred and seventy-two possible contact positions per module slot. However, and as noted above, the holes in the board 50 are only populated with miniature pin contacts to the extent required by each module 18. The spacer board 50 essentially holds or spatially supports the miniature pin contacts both vertically and horizontally from neighboring pin contacts by a distance of about 0.05 inches. The spacer board 50 is a jig that essentially holds the miniature pin contacts in the particular spaced configuration. Each pin contact 54 extends through the spacer board 50 and into the backplane board 52, which is a multi-layer type of printed circuit board. The pin contacts are soldered to the appropriate conductor pads on the back side of the backplane printed circuit board 52. In practice, the spacer board 50 is held flush against the backplane printed circuit board 52. The backplane printed circuit board 52 includes the various conductor lines forming busses between the modules, as well as to the controller module 16. The bus interface boards 50 and 52 are accurately aligned to the back of the chassis 15, and fastened thereto by a number of screws (not shown) that pass through accurately-located holes in the boards 50 and 52 with respect to corresponding threaded holes in the back edges of the upper and lower chassis panels 30 and 32. Thus, when the module 18 is inserted between the upper and lower guide rails 40 and 38, the miniature socket contacts at the back of each module 18 are pushed onto the corresponding miniature pin contacts 54 fixed to the bus backplane boards 50 and 52. The friction fit between the miniature sockets and pins provide the mechanism for maintaining the modules locked within the chassis 15.

A user interface board 56 is electrically connected to the bus backplane board 52 by way of additional pin and socket contacts (not shown in FIG. 2). The user interface board 56 includes a number of connectors to which connectorized cables can be attached for coupling the chassis assembly 10 to other equipment, such as the personal computer 14 shown in FIG. 1. A protective metal back plate 58 includes various rectangular openings (not shown) for allowing the connectors of the user interface 56 to protrude thereto. Also not shown, the metal back plate 58 is fastened to the back surface of the chassis panels by way of screws (not shown). An insulator film or board (not shown) is installed between the user interface 56 and the metal back plate 58 to prevent short circuiting therebetween. The various features of the backplane and user interface will be described in more detail below.

Figure 3:
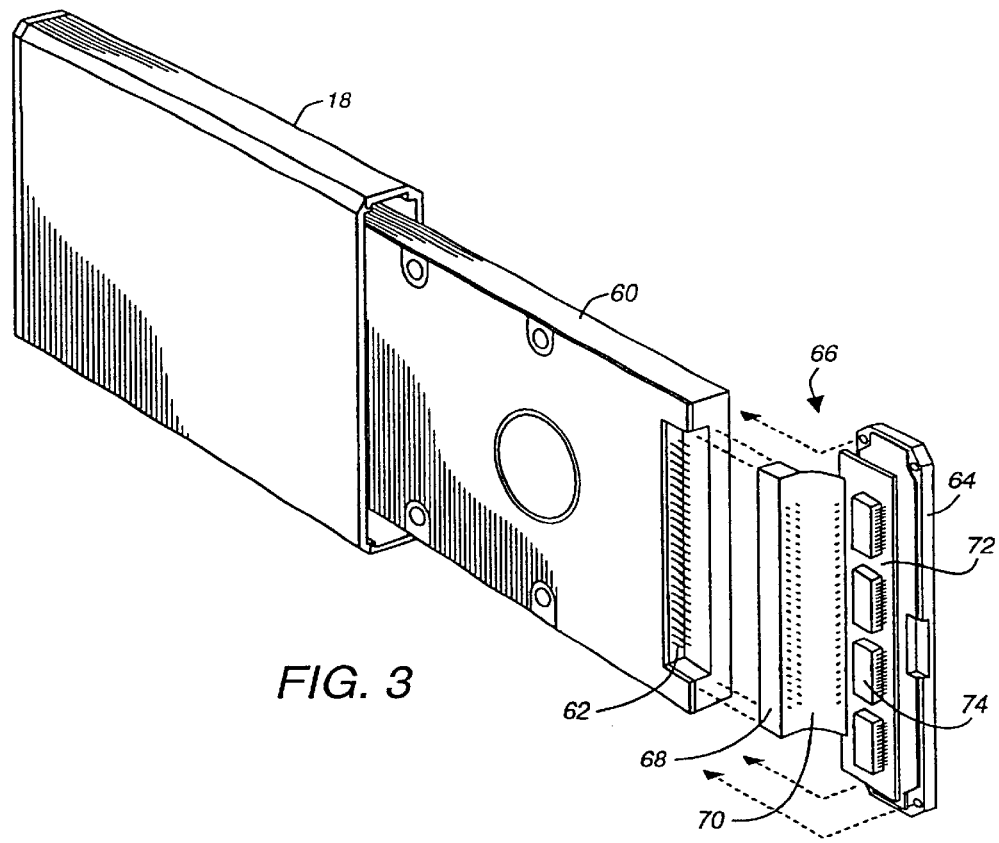
FIG. 3 is an isometric view of a hard disk drive unit insertable into a module case, with the disk drive unit being connectable to a socket connector which also holds electronic components.
Figure 4A:
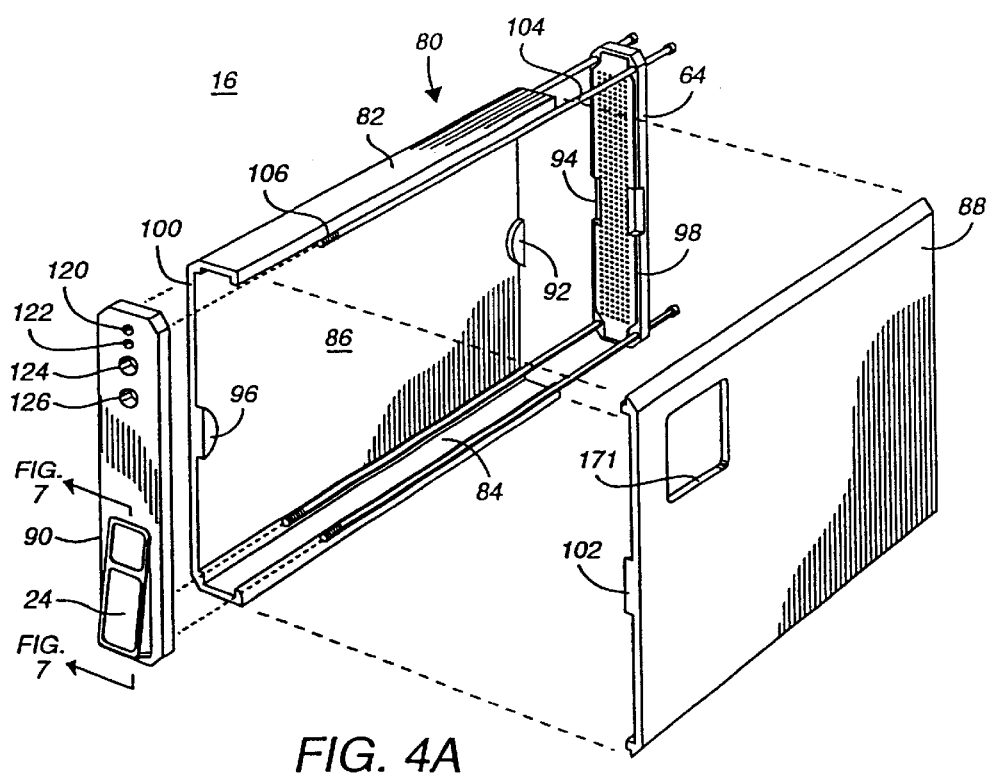
FIG. 4a is an isometric view of the component parts of a module case, shown in exploded form.

With reference to FIG. 3, there is illustrated the features of a module 18 adapted for housing a modular hard disk drive unit 60. Hard disk drives identified by model MK1926FCV, commercially obtainable from Toshiba Corporation, or similar-size drives, are well adapted-for use with the invention. The hard disk drive of such type has a length of about 4 inches, a height of about 2.75 inches and a thickness of about 0.5 inch, and can store about 814 megabytes of data. Hard disk drive units of similar physical size and capable of storing about 1300 megabytes are also commercially available. Hard disk drives having thicknesses of about 0.75 inches are available for storing about 2.16 gigabytes of data. Hard disk drives of other physical dimensions and data storage capacities can be readily adapted for use with the invention. The disk drive unit 60 is insertable within the module case 18 via a removable lid, such as shown in FIG. 4a, so as to be securely held therein. In order to facilitate the transfer of heat away from the disk drive unit 60, a metallic side cover of the unit is engaged against the inside surface of the removable lid to thereby transfer heat generated within the unit 60 to the chassis 15 via the module case. A reliable engagement between the disk drive unit 60 and the internal surfaces of the module case can be assured by using insulator foam or other resilient material on one side or edge of the unit 60 to maintain engagement with the other side or edge to the metallic module case. The resilient material can also reduce shock to the disk drive unit 60 due to impact of either the case 18 or the chassis 15. Indeed, the resilient material itself can be of a type having a high thermal transfer characteristic.

The disk drive unit 60 includes a number of pin contacts 62 adjacent the back edge thereof for communicating read, write, data and address signals to the unit 60. The disk drive unit 60 is electrically connected to a miniature socket contact collector assembly 64 which is fastened to the back opening of the module case 18. The socket contact collector 64 is constructed of a fiberglass insulator for supporting a number of miniature socket contacts at spaced apart locations identical to that of the miniature pin contacts in the backplane board 52 (FIG. 2). An interconnect circuit assembly 66 provides circuit connections between the pins 62 of the hard disk drive unit 60 and the socket contact collector 64. The interconnect circuit assembly 66 includes a socket contact connector 68 adapted for mating with the pins 62 of the disk drive unit 60. A flexible, multi-conductor cable 70 provides a number of conductors between the connector 68 and a small printed circuit board 72. The printed circuit board 72 is of the multi-layer type providing high density connection between the socket contacts of the collector 64 and various integrated circuits shown by reference numeral 74. Moreover, various miniature socket contacts supported by the collector 64 are routed via the printed circuit board 72 to the flexible cable 70, and therethrough to the disk drive unit 60, via the connector 68 and corresponding pins 62. While not shown, a number of socket contacts are soldered directly to the back side of the printed circuit board 72, with the open end thereof protruding outwardly orthogonal thereto. A small insulator spacer with multiple apertures therein is slipped over the tubular-shaped socket contacts and provides a spacing between the back side of the printed circuit board 72 and the socket contact collector 64. The spacer prevents the open ends of the socket contacts from protruding all the way through the insulator collector 64. The socket collector 64 is not fastened to either the printed circuit board 72 or the miniature socket contacts, but rather has a number of holes therein for allowing the miniature socket contacts to be snugly housed therein and protected from physical exposure. As noted above, the open ends of the socket contacts are recessed a few thousandths of an inch within respective holes of the collector 64 and are therefore accessible for insertion therein of the rounded ends of the pins 54 of the backplane board 50 (FIG. 2). The collector 64 is shown in more detail in FIG. 4a. It is noted that the socket collector 64 includes many holes for housing miniature socket contacts. However, it is necessary only to utilize as many holes as required by the circuit module to provide the requisite number of conductors. Indeed, in the preferred form of the invention, the standard disk drive unit 60 identified above requires only about thirty-five conductors, and thus thirty-five miniature socket contacts are utilized.

With reference again to FIG. 3 again, it is noted that the interconnect circuit assembly 66 is not rigidly mounted to the disk drive unit 60, but rather is flexible due to the flexible cable 70. The flexible cable also functions as a resilient member for maintaining the unit 60 pushed against the frontal inside surface of the module faceplate. As such, the flexible cable 70 acts like a shock absorber. In a preferred form of the invention, the integrated circuits 74 comprise a number of latches controlled by the controller module 16, for latching address, data and control signals for use by the disk drive unit 60. Preferably, the address and control signals are coupled unidirectionally from the controller module 16 to the disk drive unit 60, via the respective latches 74, while the data is coupled bi-directionally, via data transceivers 74, between the disk drive unit 60 and the controller 16.

It is to be noted that the disk drive module 18 shown in FIG. 3 is entirely removable from the chassis assembly 10, as well as reinsertable. In this manner, data can be removed as a package from the chassis assembly 10 and maintained safe by the user, can be stored for archival purposes, or can be transported from an office computer to a home computer. It can be appreciated that the user accessability to removable disk drive units substantially enhances the flexibility of data storage, retrieval, security and repair of the unit.

Figure 4B:
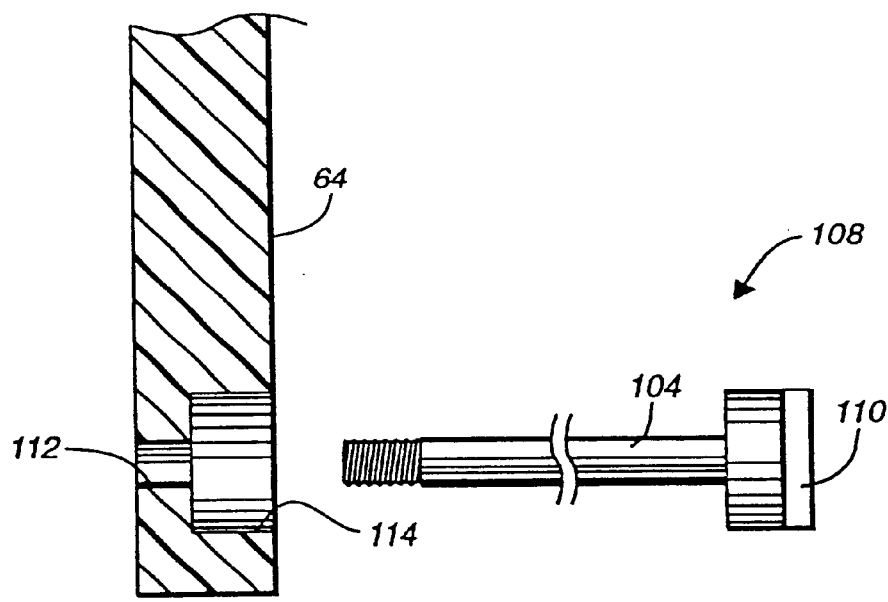
FIG. 4b is an enlarged partial sectional view of the fastener hole formed in the socket contact collector.
Figure 5B:
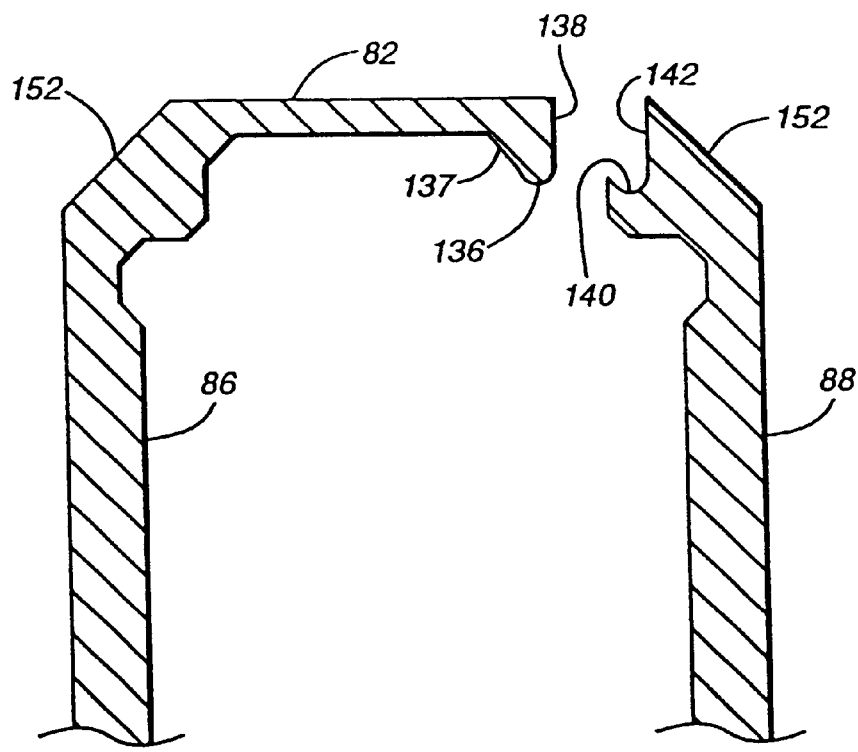
FIG. 5b is an enlarged and partial cross-sectional view of the shape of the removable lid that is snap fit to the module cover.

With regard to FIG. 4a, there is illustrated the mechanical features of the module case shown by reference character 16 in FIG. 1. The components of the module case shown in FIG. 4 are held together by four long screws, with the exception of the snap-fit lid 88 described below. The module case 16 is similar in construction to the other modules 18–20 shown in FIG. 1, with the exception of the faceplate and the number and types of components fastened thereto, and the removable lid of the disk drive modules 18 and 20 do not have a window or opening formed therein. In the preferred form of the invention the module case 16 includes a three-sided integral protective cover 80 having a top side 82, a bottom side 84 and a vertical fixed side 86. A snap-fit lid 88 is removably attached to the module cover 80 by the utilization of contoured surfaces and edges more particularly shown in FIGS. 5a and 5b. The module cover 80 and the removable lid 88 are machined from an aluminum material and thereafter anodized to prevent oxidation as well as to facilitate insertion of the module into the chassis 15, via the upper and lower guide rails 40 and 38. A faceplate 90 of the module is also constructed of aluminum and thereafter anodized. The socket collector 64 is constructed of an insulator material, such as fiberglass or plastic. The fixed side 86 of the module cover 80 includes on the rear inside surface thereof a stop 92 that protrudes inwardly from the module case. The stop 92 engages against a recessed area 94 on the insulator collector 64. In this manner, external pressure on the middle portion of the insulator collector 64 prevents bowing thereof toward the internal part of the module. This enhances the rigidity of the insulator contact collector 64, especially when a large number of miniature sockets of the module and pin contacts of the chassis are engaged together.

Formed also on the internal surface of the fixed side 86 of the module cover 80, near the frontal edge thereof, is a similar stop 96 that engages with a recessed area (not shown) formed on the back side of the faceplate 90. The recessed area of the faceplate 90 abuts against the stop 96 and prevents the faceplate from bending inwardly when external pressure is applied to the module case 16 when inserted into the chassis 15. The insulator collector 64 includes a recessed peripheral edge 98 therearound on the internal edge thereof for fitting therein of the back edge of the module cover 80 and the removable lid 88. While not shown, the back peripheral edge of the faceplate 90 is similarly recessed so as to be fittable to the frontal edge 100 of the module cover 80 and the frontal edge 102 of the removable lid 88.

Figure 7:
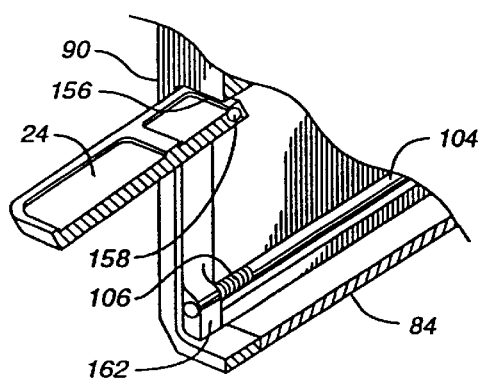
FIG. 7 is a partial sectional view of a pull-tab hinged to the front cover of the module case.

The insulator collector 64 and the faceplate 90 are not directly fastened to the module cover 80, but rather are fastened to each other by way of four elongate screw fasteners, one of which is shown by numeral 104. The elongate fasteners 104 include threads 106 at one end thereof, for threadable engagement into corresponding threaded holes formed on the back side of the faceplate 90, shown more particularly in FIG. 7. The elongate fastener 104 includes a head 108 shown in more detail in FIG. 4b, together with the engagement thereof to the insulator collector 64. The head 108 of the fastener 104 is larger in diameter than the shaft and includes a diametric thinned portion 110 for grabbing with a tool to rotate the fastener 104. The insulator collector 64 includes a first bore 110 of a diameter for accommodating the shaft of the fastener 104, and a second, larger bore 114 of a diameter for accommodating the head 108 of the fastener 104. In practice, when the assembly of the module case 16 is completed, the head 108 of the fastener 104 is recessed and hidden entirely within the larger-diameter bore 114 of the insulator collector 64. As can be appreciated, when the four elongate fasteners 104 are inserted through the corresponding corner holes in the contact collector 64, and threaded into the corresponding holes of the faceplate 90, the collector 64 and the faceplate 90 are pulled together, with the three-sided module cover 18 compressed therebetween. The removable lid 88 is slightly shorter in length than the cover 18, and thus not compressed between the contact collector 64 and the faceplate 90. In certain instances or applications, it may be advantageous to fully assembly the electrical circuits within the case 16 and then securely fix the lid 88 thereto by a suitable adhesive. With this construction, the electrical components are not easily accessible.

The module case 16 shown in FIG. 4a comprises a controller module that houses a digital signal processor and associated circuits mounted on three multi-layer printed circuit boards. The faceplate 90 includes small holes 120 and 122 for holding respectively a read led and a write led. Larger holes 124 and 126 hold respectively a push-type controller reset switch and an optional switch. The indicator leds and switches are mounted to the internal printed circuit boards, but protrude through holes in the faceplate 90. Hingably fastened to the faceplate 90 is a pull-tab 24 shown in more detail in FIG. 7.

Figure 5A:
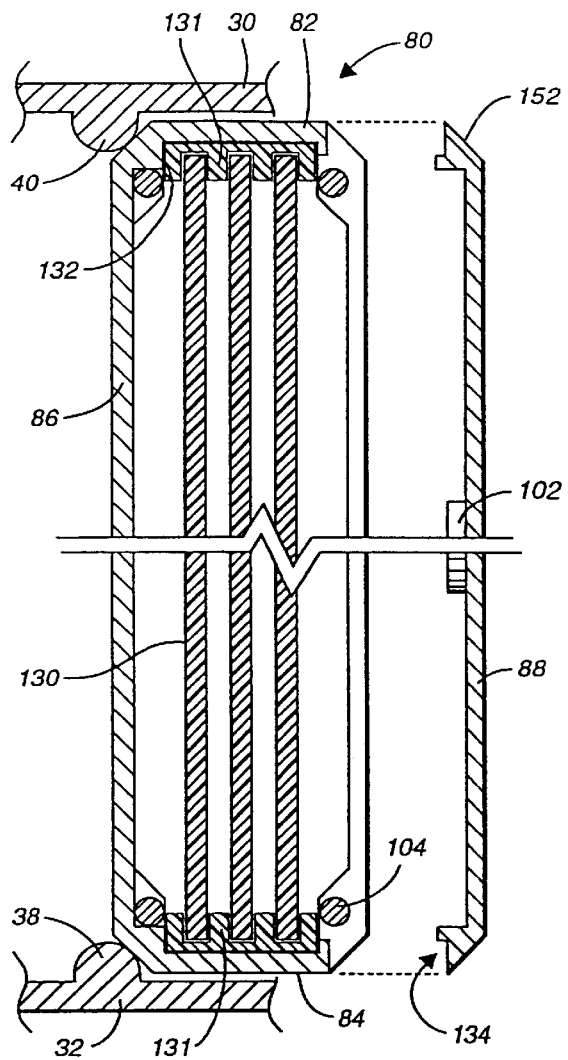
FIG. 5a is a sectional view of a module case with three circuit boards held therein, and with the side cover shown removed therefrom.

With regard to FIG. 5a of the drawings, there is shown the module case 80 that encloses three printed circuit boards, one of which is identified by reference numeral 130. The module case 80 includes the three-sided cover 86 and the removable lid 88. Formed on the internal four corners of the module case 80 are elongate shoulders 132 for centering therebetween upper and lower guides 131 that are slotted for sliding therein the printed circuit boards. The upper and lower guides 131 includes elongate slots formed therein to receive the upper and lower edges of the printed circuit boards. The guides 131 can be constructed of an insulating material such as fiberglass, or with an adhesive-backed foam material that is adhered to the edges of the printed circuit boards. The foam material can be preformed to provide channels for separation of the boards 130, as well as to provide insulation between the components or conductor paths and the elongate shoulders 132 of the module case 16. Additional wrap-around insulating tape or films can be employed to provide electrical insulation between the electrical components and the conductive module case. While not shown in FIG. 5a, there are preferably additional socket-pin connections between the center printed circuit board and the outer boards, thereby providing electrical paths therebetween as well as physical separation.

The guides 131 are first inserted over the upper and lower edges of the plural circuit boards, and the assembly is then slid into the module case 80 via the open back end thereof. It can be appreciated that the guides 131 prevent the conductors and components mounted on the printed circuit boards from short circuiting either between the boards or to the metal case 80. In this manner, the conductor pads and lines on the outside surfaces of the printed circuit boards 130 are maintained spaced from the elongate fasteners 104, thereby preventing short circuits therebetween. Of course, the printed circuit boards 130 are designed so as not to have any conductor pads or components near the surface edges that engage the elongate shoulders 132 or the case.

The removable lid 88 of the module case 16 includes elongate edge configurations 134 that snap lock with special shaped edges of the module top cover 82 and module bottom cover 84. The upper and lower engaging surfaces between the removable lid 88 and the module cover edges are identical, one being shown enlarged in FIG. 5b. The edge of the cover top 82 is machined with a downwardly depending rounded edge 136. The rounded edge 136 tapers inwardly to the internal surface. The tapered surface 137 facilitates removal of the lid 88 from the three-sided cover 80. The outer face edge 138 of the cover top 82 is flat and formed orthogonal to the top surface.

The removable lid 88 includes an elongate channel receptacle formed with a rounded trough 140 to receive therein the rounded edge 136 of a cover edge. When the removable lid 88 is pushed onto the module cover 80, the elongate rounded edge 136 of the cover top 82 engages within the machined receptacle trough 140 of the lid 88 and is mechanically snap locked therein. When snap-locked together, an internal vertical surface 142 of the removable lid 88 engages against the corresponding outer flat surface 138 of the cover top 8.2. The engagement between the surfaces 138 and 142 is important in maintaining a precise lateral dimension to the overall module 16 so as to be accurately aligned within the guide rails 38 and 40 of the chassis 15, as shown more fully in FIG. 6. The snap-fit structure of the top side 82, the bottom side 84 and the top and bottom edges of the lid 88 are identical.

In order to remove the lid 88, a screwdriver or other similar object is forced between the edges 138 and 142 to thereby pry the parts apart. Because the channel receptacle 140 is cupped, one of either the engaging rounded edge 136 or the side cover 88 must distort slightly in a vertical direction to become disengaged. In practice, the removal of the engaged parts bows the side cover 88 slightly outwardly to allow disengagement between the rounded cover edge 136 and the channel receptacle 140 of the lid 88. This is important in preventing the side cover 88 from becoming inadvertently removed due to pressures exerted on the module, metallic contraction due to temperature changes, etc. Moreover, the anodized surface finish of the metallic parts functions somewhat as a lubricant to facilitate the removal of the metallic parts.

Figure 6:
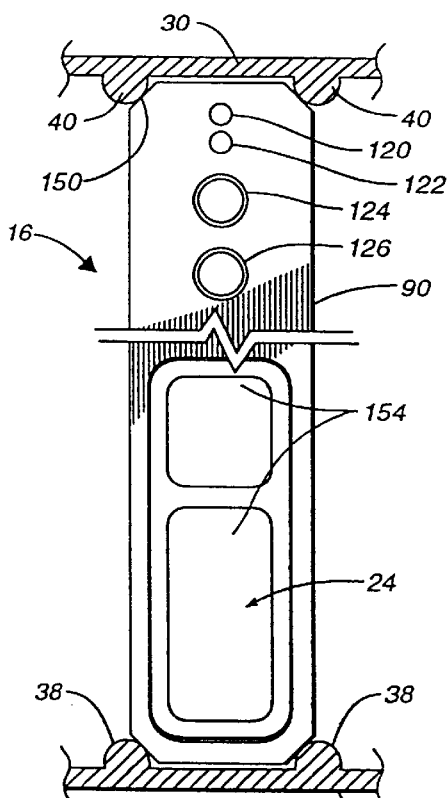
FIG. 6 is a front view of a module case held in alignment at the four corners thereof by the chassis guide rail structure.

With reference now to FIG. 6, there is illustrated the manner in which the module 16 is accurately aligned within the chassis 15, so that the module miniature socket contacts and backplane pin contacts 54 remain aligned and can be forcefully engaged without bending of the miniature pins. As noted above, each corner of the module 16 includes a 45° bevel or chamfer, one shown as reference character 150. In practice, the diagonal dimension of the bevel as shown in FIG. 6 is about 0.125 inches and extends longitudinally along the entire length of the four corners of the module 16.

Machined on both the chassis top panel 30 and the chassis bottom panel 32 are spaced apart guide rails 40 and 38. The guide rails 40 and 38 extend generally orthogonal from the inside surface of the chassis top panel 30 and the chassis bottom panel 32. However, the cross-sectional shape of the guide rails is generally rounded so that a curved portion of the rail engages with a corresponding corner bevel 150 of the module 16. With this arrangement, very little sliding or frictional contact exists between the bevel surface 150 of the module 16 and the rounded guide rails 40, thereby minimizing friction. The specific shape of the contact edges of the guide rails 38 and 40 can be other shapes, such as square or triangular corners, etc. Further, the guide rails 38 and 40 are constructed of anodized aluminum, as is the module cover 80 thereby reducing the sliding friction. More importantly, the four corner contact surfaces 150 of the module with the respective guide rails 38 and 40 provides both a vertical and horizontal registration, to thereby ensure a highly accurate alignment of the module 16 within the chassis 15. This, in turn, assures a very accurate alignment between the module socket contacts and the chassis back plate pin contacts 54. This guide rail module contact configuration differs from the prior art structures which are either vertical or horizontal surfaces that provide either a vertical or horizontal placement of the module within the chassis, but not both. As noted above, despite that the lid 88 is removable, the bevel surfaces 152 (FIG. 5*b*) do not interfere with the accuracy of alignment, as the machined vertical surfaces 138 and 142 assure the lateral dimensional consistency of the spacing between the top corner bevels and the bottom corner bevels of the module case 16. The registration tolerance between the module case 16 and the chassis 15 can be maintained within about ±0.002 inches. In view that a miniature contact pin 54 (FIG. 2) of the chassis backplane has a rounded end and a diameter of about 0.016 inches, the insertability thereof into a corresponding socket contact is assured to a high degree of accuracy.

The hinged pull tab 24 shown in FIG. 6 includes two slightly recessed face areas 154 for applying thereto a decal or sticker bearing identification or other indicia of the module. The construction of the hinged pull tab 24 is shown in more detail in FIG. 7. The faceplate 90 includes an opening 156 therein for the pull tab 24. The pull tab 24 includes a channel formed laterally on the inside face of the faceplate 90, in which a pin 158 is adhered by a suitable adhesive. The protruding ends of the pin 158 loosely fit within corresponding channels 160 (FIG. 8) of the inside surface of the faceplate 90. When the faceplate 90 is fastened to the frontal edge of the module case 16 with the long screws 104, the ends of the hinge pin 158 are captured between the module case edges and the faceplate channels 160. With this construction, the pull tab 24 can be hinged outwardly and pulled, thereby forcefully removing the module 16 from the chassis 15. Importantly, the bottom of the pull tab 24 does not become recessed entirely within the window 156 of the faceplate, as is the top portion of the pull tab 24. Rather, the bottom portion of the pull tab 24 remains hinged slightly outwardly at the bottom thereof as shown in FIG. 4*a* to thereby allow a user to easily grasp the pull tab 24 and pivot it further outwardly for firm grasping. Formed on the inside corner of each of the-four inside corners of the faceplate 90 is an ear 162 having a threaded hole for securement therein of the elongate fastener 104. Further, the ear 162 is located to function as a stop so that the bottom of the pull tab 24 cannot be hinged fully inside the window 156, but rather remains slightly pivoted outwardly, as noted above.

Figure 8:
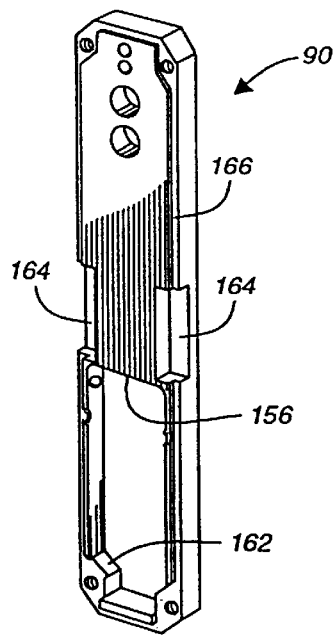
FIG. 8 is a back view of the front cover of a module case of FIG. 4, with the hinged pull-tap removed.

FIG. 8 shows the general construction of the features formed on the inside surface of the faceplate. Shown are the recessed areas 164 that abut against the cover side stops 96, shown in FIG. 4*a*. Also shown is the inner recessed peripheral edge 166 which accommodates therein the frontal edge of the module cover 80 as well as the frontal edge of the removable lid 88.

Figure 9:
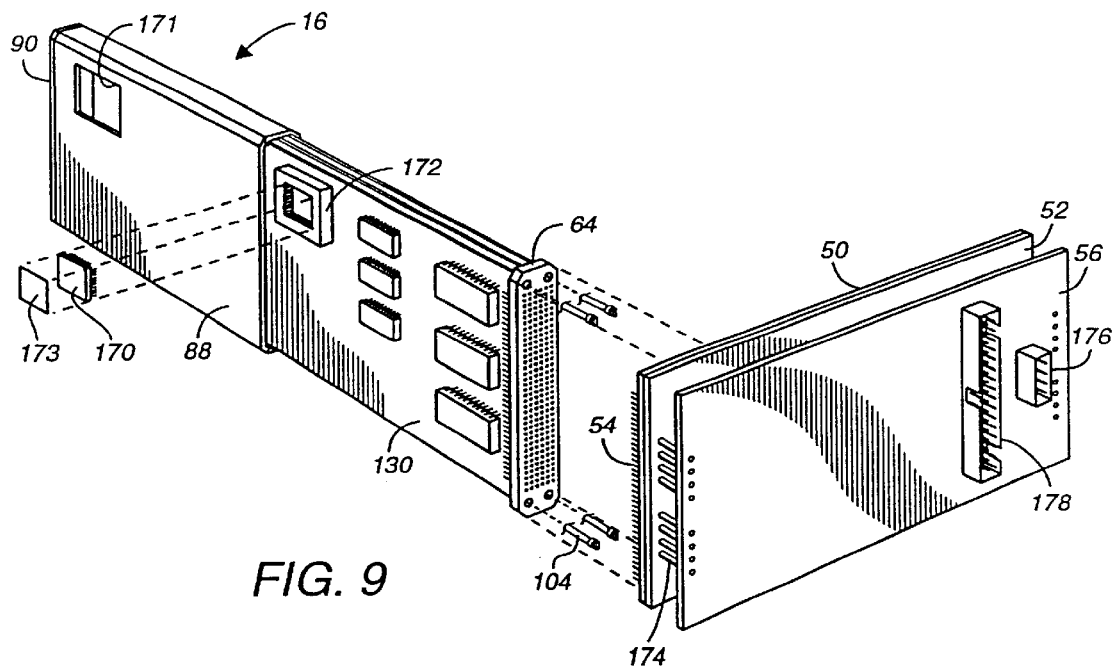
FIG. 9 is an isometric view of a three-board circuit assembly housed by the module case, and where the socket connector thereof is connectable to a multi-pin backplane assembly.

FIG. 9 illustrates in more detail the association between the module case 16 and the apparatus housed thereby, in conjunction with the various backplane boards. Also shown in detail is the printed circuit board 130 having various integrated circuits mounted thereto, including a replaceable erasable programmable read only memory (EPROM) 170. The removable lid 88 of the module case 16 includes a window 171 that is aligned with the EPROM 170, when fully inserted into the socket 172. The EPROM chip can have adhesively attached thereto a label 173 which has identifying indicia printed thereon. In this manner, the EPROM 170 can be removed and replaced with a new programmed chip, without removing the printed circuit board 130 from the module case 16, and without removing the removable lid 88. This allows easy update of the software programming of the processor housed in the control module 16.

Also shown in FIG. 9 is the manner in which the user interface board 56 is electrically connected to the backplane bus board 52, via a plurality of socket and pin contacts 174. Various connectors can be fastened to the user interface board 56, and particular to the conductor paths formed on the opposite side of the board shown in FIG. 9. For example, a connector 176 can be provided for coupling various supply voltages and ground potentials between the chassis assembly 10 and the personal computer 14. Another connector 178 can be utilized for providing SCSI bus connections between the computer and the chassis assembly 10. Lastly, an optional third connector (not shown) can be utilized for connection to an uninterruptable power supply. Many other varieties, numbers and types of connectors can be utilized to accommodate the particular application to which the invention may be employed. In accordance with an important feature of the invention, the user interface board 56 is removable from the backplane 52 by way of the pin-socket connections 174. With this arrangement, different user interface boards 56 can be employed to accommodate different user applications, all without requiring a different chassis 15 or a backplane 52. Other types of user interface boards 56 electrically pluggable to the backplane 52 can employ multiple user ports or connectors, different power supply arrangements, and different types of bus connectors 178, other than the SCSI bus noted above. The versatility and utilization of different user interface boards 56 greatly facilitates the inventory and assembly of module and chassis assemblies that perform different functions. For example, in assembly line construction of the invention, the same chassis, modules and backplane 52 can be assembled together, but with different user interface boards to custom tailor the interface to the particular user needs.

In addition to the foregoing, different backplane boards 52 can be utilized to provide different interconnections to the modules, as well as different connections to the user interface board 56. An inventory of different backplanes allows the use of the same chassis and many of the modules, but interconnects them differently to carry out different functions. Indeed, instead of a single processor or controller module, two different controllers can be utilized, interconnected by a different backplane, to carry out multitasking or other functions. Where additional data storage capacity or higher speed access thereto is needed, additional chassis slots can be populated with hard disk drive modules. The utilization of parallel-operated hard disk drives is significantly more advantageous, especially in terms of reliability, than the use of high RPM hard disk drives that increase the access speed to any of the data stored thereon. Should different software be required to operate with a different user interface board 56, then a different EPROM can be utilized by the simple removal of the processor module 16, and the exchange of the existing EPROM with a newly programmed EPROM 170.

Figure 10:
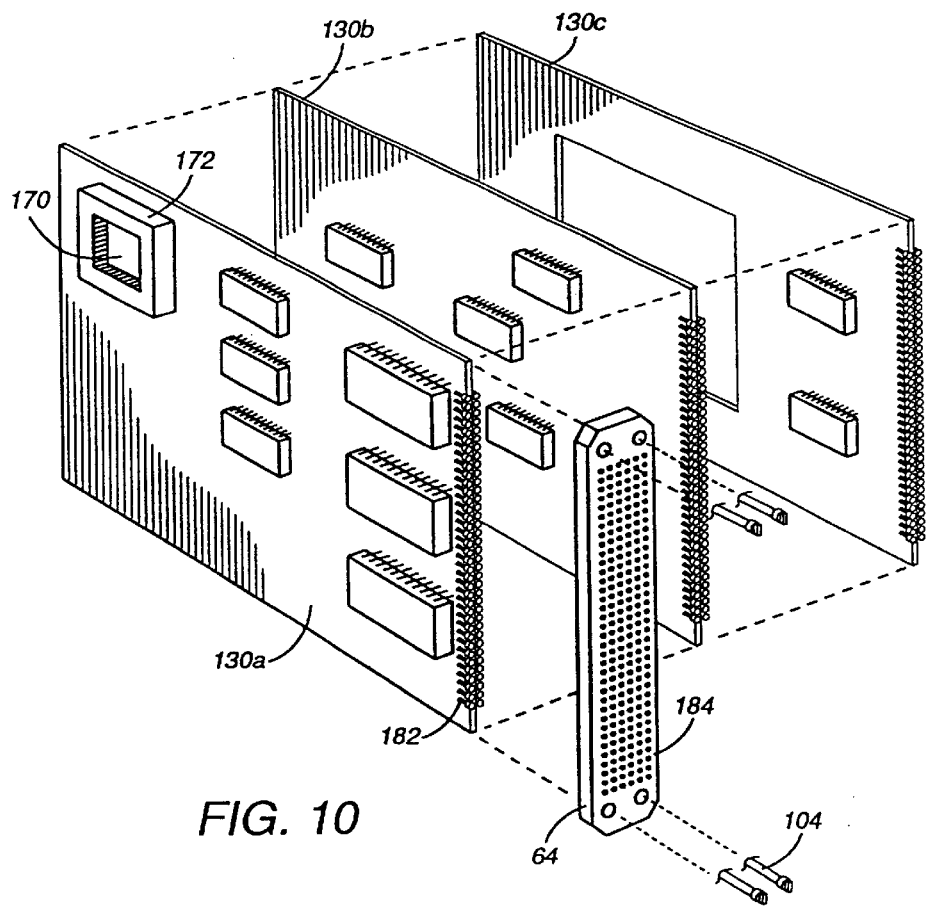
FIG. 10 is a drawing showing the three circuit boards of FIG. 9 and associated socket connector shown in exploded form.

The three printed circuit boards 130*a–c* of the controller module 16 are shown in FIG. 10, as they relate to the socket contact controller 64. As noted with regard to the printed circuit board 130*a*, there is shown a set of metallic contact pads 182. Indeed, such contact pads appear on both sides of the rear edge of the printed circuit board 130a. In like manner, the other two printed circuit boards 130b and 130c also include similar pads for soldering thereto the miniature socket contacts. Each printed circuit board 130a–c may or may not be fully utilized with regard to all contact pads 182. There can be formed a maximum of about six vertical rows of contacts on the three printed circuit boards, which, when assembled together, are aligned with the corresponding six vertical rows of holes 184 in the socket contact collector 64, which in the preferred from, is only about one-half inch wide. As can be seen in FIG. 5a, there is additional space for two additional printed circuit boards, which are preferably shorter in height so as not to interfere with the inside corner structures of the module case 16. When five printed circuit boards are employed, a total of ten parallel rows of contacts are available, providing a sufficient number of electrical connections to accommodate a 512-bit bus and control signals.

Figure 11:
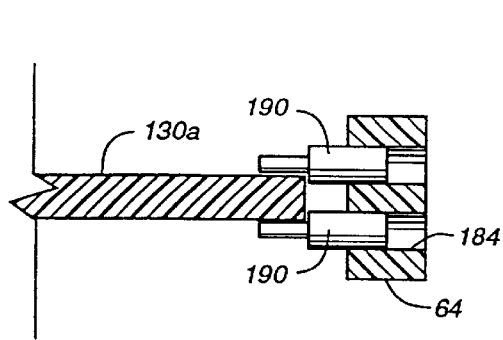
FIG. 11 is an enlarged and partial cross-sectional view of a printed circuit board with the miniature socket pins soldered thereto and maintained aligned by an apertured spacer board.
Figure 12:
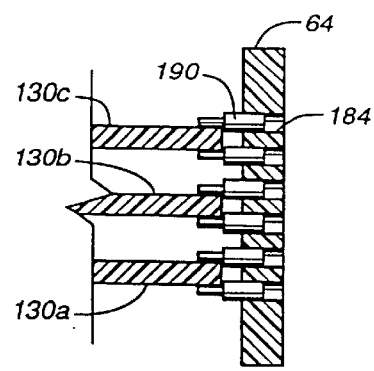
FIG. 12 is a partial cross-sectional top view showing three of the circuit boards of FIG. 11.
Figure 13:
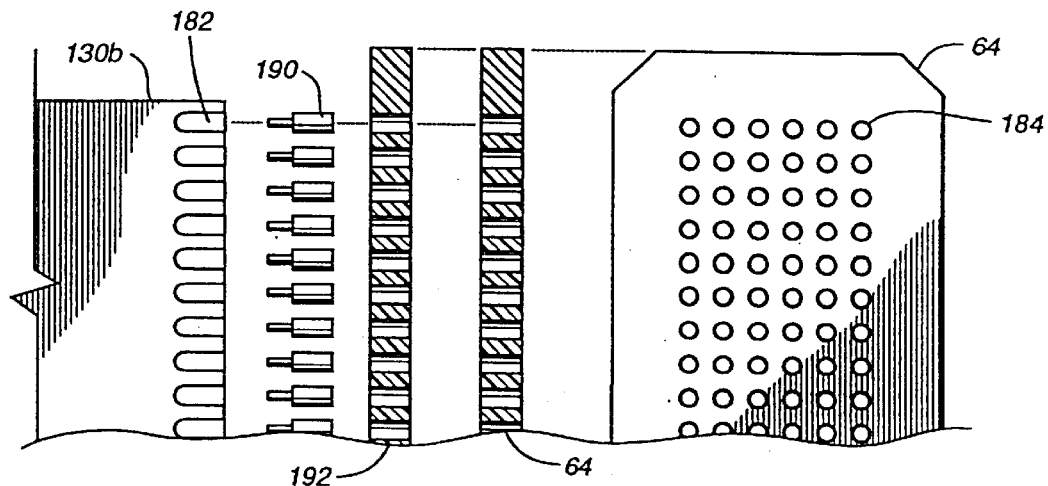
FIG. 13 is a side view of a printed circuit board showing the miniature socket contacts, the spacer board and an apertured faceplate;.

FIGS. 11–13 illustrate the details of the high density contacts for providing a large number of separate electrical signals to compact printed board circuitry housed within a module case. In FIG. 11, there is illustrated a printed circuit board 130a as viewed from the top. Each hole 184 drilled in the fiberglass socket collector 64 includes a small annular chamfer (not shown) at the entrance end thereof. This helps in centering the socket contacts 190 for insertion into the collector plate holes 184.

FIG. 12 illustrates a top sectional view of the three printed circuit boards, and FIG. 13 shows a side view of the center printed circuit board 130b, with a spacer 192 to limit the extent by which the module socket contacts 190 enter into the holes 184 of the collector 64. Three such printed circuit boards 130a–c are shown held in a close spaced-apart relationship at the rear end thereof by the socket contact collector 64. As noted above, the grooved tracks formed in the top and bottom insulator board guides 131 maintain the elongate edges of the printed circuit boards spaced apart. With specific reference to FIG. 11, and 13, miniature socket contacts 190 are soldered or otherwise electrically fixed to the conductor pads 182 formed adjacent the rear edge of the board. The enlarged barrel of the socket contact 190 includes an internal spring contact (not shown) for providing a high quality electrical connection to a pin contact 54 when inserted therein. The socket and pin contacts are of conventional design and readily available.

In the assembly of the printed circuit boards 130 and corresponding socket contacts 190, an insulator spacer 192 is utilized on the two rows of contacts 190 of the middle printed circuit board 130b for limiting the entry of all six rows of socket contacts 190 within the collector 64. Importantly, the spacer 192 prevents the socket-contacts 190 from protruding all the way through the socket collector 64. The spaced relationship between the socket contacts 190, both vertically and laterally correspond identically to the spacing of the holes 184 of the socket collector 64 shown in FIG. 13. Only one spacer 192 having two vertical rows of holes is necessary, although a wider spacer could be utilized to accommodate all six rows of socket contacts on the three printed circuit boards. The holes in the spacer 192 are sized so as to loosely surround the respective socket contacts 190. During assembly, a socket collector jig (not shown) is populated with the requisite number of socket contacts 190, which are firmly held therein, depending upon the need therefor to provide sufficient I/O signals to two rows of solder pads 182. When the collector jig is appropriately populated with socket contacts 190, such contacts are held against the respective solder pads 182 on both sides of the board 130a, as shown in FIG. 11. Once the printed circuit board 130a is fixed with respect to the spacer 192, the socket contacts 190 are either individually or collectively soldered as a group to the respective pads 182. Thereafter, the collector jig is removed from the socket contacts 190, whereupon such contacts remain spatially aligned and separated by virtue of being rigidly fixed to the printed circuit board 130a. In FIG. 13, the spacer 192 is shown in association with the socket contacts 190 of the middle printed circuit board 130b. Also shown in FIG. 13 is a cross-sectional view of the socket collector 64, as well as an end view thereof. The next step of the assembly is the insertion of the individual printed circuit boards 130a-130c, and particularly the socket contacts 190 thereof into the holes 184 formed in the socket collector 64. Each printed circuit board can be separately mounted in such manner, whereby the socket collector 64 provides a fixed and spaced-apart relationship between both the socket contacts 190 themselves, as well as a spaced relationship of the back vertical edges of the printed circuit boards 130a-130c.

Figure 14:
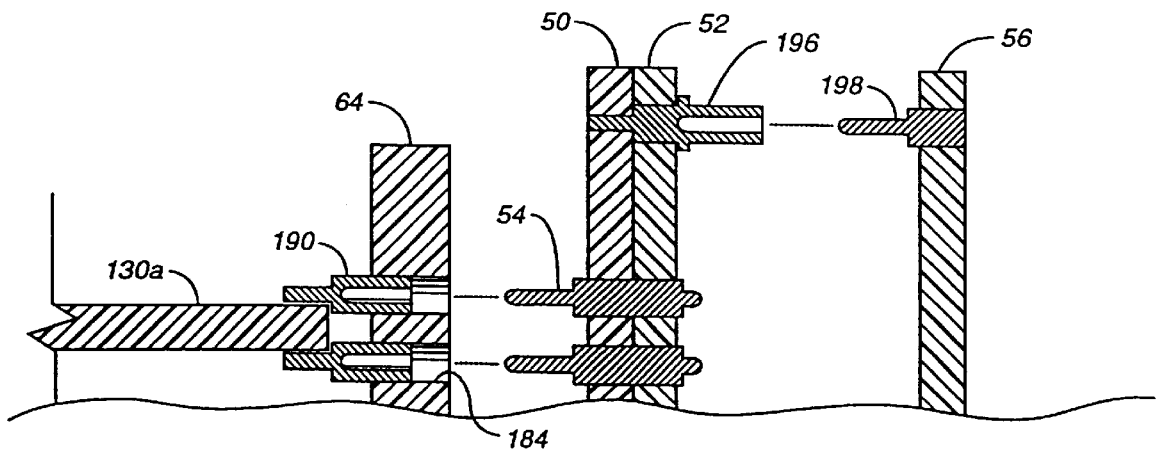
FIG. 14 is a sectional view of the interconnectivity of a module case to a backplane, and the backplane to a corresponding connector apparatus.

FIG. 14 illustrates a partial sectional view of the electrical connections between one printed circuit board 130a, the backplane boards 50 and 52 and the user interface board 56. The general purpose of the insulator board 50 is to hold the pin contacts 54 in a specific spacial relationship so as to be mateable as a unit with the module socket contacts 190. As shown, the miniature pin contacts 54 soldered within the backplane boards 50 and 52 provide an electrical connection to the miniature socket contacts 190 that are part of the insertable module. While not shown, numerous conductor pads are formed on the backplane board 52, in contact with selected ones of the miniature contact pins 5.0. Moreover, additional socket contacts 196 are soldered to the backplane boards 50 and 52 to provide power and signals thereto. The socket contacts 196 may be physically larger than the miniature socket contacts 190 to handle the requisite electrical power or supply voltage. Corresponding pin contacts 198 are soldered to the user interface board 56, which pins are mateable with the sockets 196 to provide electrical connections between the user interface board 56 and the backplane boards 50 and 52. While not shown, the various connectors 176 and 178 in FIG. 9 are soldered to the various conductors of the user interface board 56. As such, supply voltages and electrical signals can be communicated between the personal computer 14 and the chassis assembly 10. As noted above, different types of user interface boards 56 are pluggable into the backplane 52 for accommodating different applications required by the user. In like manner, different backplane boards 50 and 52 can be used with the chassis 15 to accommodate different connections between the various modules. For example, when some of the modules utilized are for mass memory storage, such as hard disk drives, FLASH EPROM, ferroelectric memories, etc., such memory modules can be connected in series or in parallel by way of different backplane boards 50 and 52. When employing hard disk drives, the bandwidth of the system can be increased by operating the drives in parallel with one type of backplane 52, without requiring higher rotating speeds of the disk drives. In view of the foregoing, many different user applications can be accommodated by the utilization of different backplanes and different user interface boards, each of which is pluggable to each other, and easily assembled with the chassis 15.

FIGS. 15 and 16a depict a blank faceplate 200 that can be utilized with the chassis 15 for covering unused module slots. The blank faceplate 200 is constructed for snap locking to the bezel 46 of the chassis 15 to thereby provide easy removal or installation of the faceplate. The blank faceplate 200 enhances the aesthetic appearance of the chassis 15, as well as prevents dust and other airborne particles from easily entering the internal portion of the chassis. The blank faceplate 200 is preferably constructed, such as by machining or molding, of the same material as the chassis 15, and then painted, anodized or otherwise colored to match that of the chassis 15.

The blank faceplate 200 includes top and bottom edges having snap-lock members that engage with corresponding members machined into the bezel 46. The snap-lock engaging members formed at the top and bottom of the blank faceplate 200 are essentially identical, one being shown enlarged in FIG. 16b. The bezel 46 includes a cupped or cut-out portion 202 formed laterally along the entire width of the slot opening, as shown in FIG. 17. The same type of cut-out area 202 is formed in the top portion of the bezel 46. Although the cut-out portion 202 is shown generally rectangular in shape, it can be formed with many other shapes, such as concave, oval, round, triangular, etc. At the bottom edge of the blank faceplate 200, a complementary-shaped lip 204 is formed. The lip 204 projects a small distance beyond the visible lower edge 206 of the blank facepl2ate 200. The lip 204 is preferably not formed along the entire top and bottom edge of the blank faceplate 200, but rather along only a portion thereof, such as between the beveled corners of the faceplate. Alternatively, the lip 204 can comprise several short lips or individual projections for fitting into corresponding-shaped depressions formed in the bezel 46. In the preferred embodiment of the invention, the extent by which the lip 204 extends beyond the bottom edge 206 is about 0.020 inch, and the depth of the lip 204, as shown in the enlarged portion of FIG. 16, is about 0.030 inch. Those skilled in the art may find that rounding the corners of the lip 204 facilitates the installation or removal of the blank faceplate 200 from its snap-lock engagement with the chassis bezel 46. In some instances, it may be preferable to form the snap-lock projection on the bezel 46, and form the cupped area in the edge of the blank faceplate 200.

The installation is accomplished by first engaging the lower lip 204 into the cut-out portion 202 of the lower bezel 46 and then firmly pushing in the top of the blank faceplate 200 to thereby forcefully cause engagement of the upper lip and corresponding cut-out area. Although the blank faceplate 200 is not shown equipped with a hinged pull tab, such a structure could additionally be employed to easily remove the blank faceplate 200 from the chassis 15. The faceplate 200 can otherwise be removed by removing a module from an occupied adjacent slot, and reaching therein and pushing from the backside of the blank faceplate 200 to disengage either the top or bottom snap-lock structures.

Figure 18:
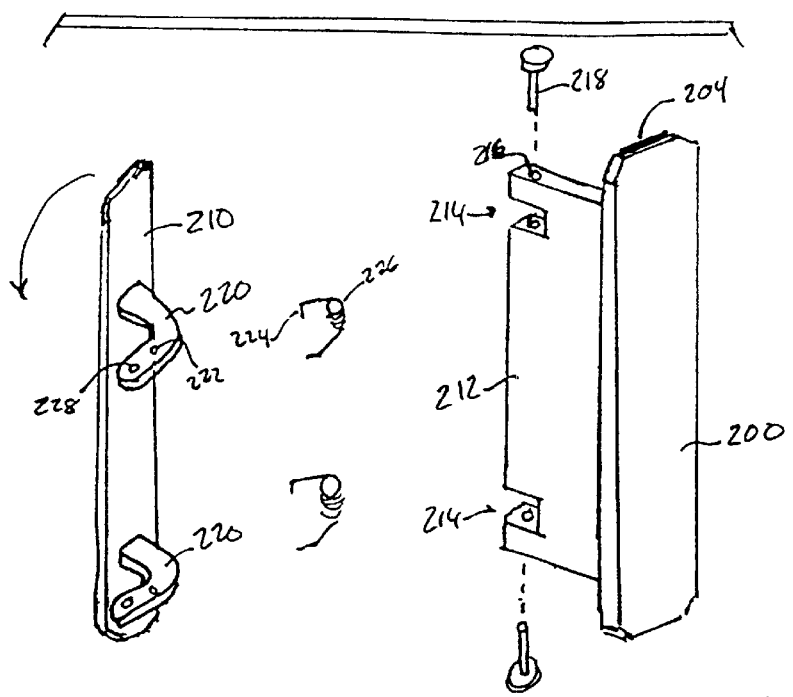
FIG. 18 is an exploded view of another embodiment of the blank faceplate, with a spring loaded cover member hinged thereto, to provide a cover for an opening of an adjacent module slot.
Figure 19:
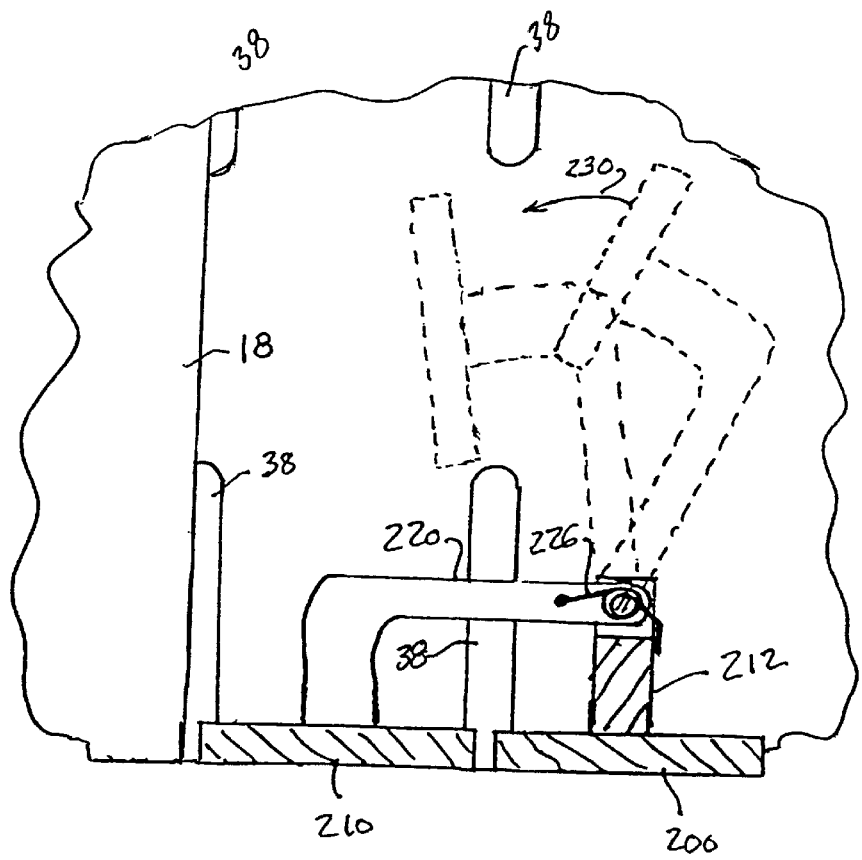
FIG. 19 is a partial sectional view of the hinged cover and blank faceplate of FIG. 17, with the cover shown in broken lines hinged to an out-of-way position.

With regard to FIGS. 18 and 19, there is shown additional structure fastened to the blank faceplate 200 for providing a hinged cover to an adjacent unoccupied module slot, as shown in FIG. 19. The cover 210 is hinged with a spring-loaded arrangement to the blank faceplate 200. A planar bracket member 212 is fastened or formed integral with the blank faceplate 200. The bracket member 212 includes two slotted openings 214 formed in the rear vertical edge thereof with corresponding holes 216 formed therein for insertion of respective compression-fit pins 218.

The cover 210 includes a pair of right-angle arms 220 fastened thereto or formed integral therewith, each arm being thinner than the height of the corresponding slotted opening 214 formed in the bracket 212. Each arm 220 includes a small hole 222 therein for engagement with the down-turned end 224 of a spring 226. Both the spring 226 and the angle arm 220 are fitted within the slotted opening 214 of the faceplate bracket 212. The pin 218 is then inserted through both the opening formed by the coils of the spring 226, as well as through the hole 228 formed near the end of the angle arm 220.

The assembled arrangement of one hinged, spring-loaded structure is shown in more detail in FIG. 19. The hinged cover 210 can be pivoted to the position shown in broken line in FIG. 19, whereby the spring 226 attempts to force the hinged cover 210 in the direction shown by arrow 230. The hinged cover 210 can be manually pivoted as shown in FIG. 19 for easy insertion of the blank faceplate 200 into an unoccupied module slot. After snap-locking the blank faceplate 200 into the bezel 46, as described above in connection with FIGS. 15–17, the cover 210 will be spring biased to the position shown in solid line, thereby providing a cover to an adjacent unoccupied module opening. In the event that a module is inserted in the otherwise blank opening, the cover 210 is automatically pushed backwardly out of the way by the insertion of the module into the slot. The hinged cover 210 is thus moved out of the path of entry of the module, into the unoccupied module area covered by the blank faceplate 200. When the inserted module is removed, the spring-loaded cover 210 returns to its position covering the module opening in the chassis. While not shown, various stop members may be constructed on either the arm 220 or the cover 210 itself so that the cover 210 does not pivot outwardly beyond the module slot opening.

FIG. 19 illustrates the guide rails 38 with a portion thereof removed so that the hinged faceplate 210 can be pivoted into the space of an adjacent slot. The interruption in both the top and bottom guide rails of the chassis 15 does not otherwise affect the insertability, withdrawal or alignment of the module case 18 with respect to the backplane pin contacts 54. In order to shorten the length by which the guide rails 38 are removed to accommodate the passage of the hinged faceplate 210 therethrough, the frontal faceplate 210 can be hinged to the right angle arm 220 and biased with a spring so that the faceplate 210 is not orthogonal to the end of the arm 220 as shown. With this additional hinged arrangement, the interruption in the guide rails 38 can be reduced. The spring biased faceplate 210 can be mounted to the arm 220 with a planar spring-like material so that after flexing to pass through the guide rail openings, the faceplate 210 returns to its rest position as shown, orthogonal to the end of the arm 220.

From the foregoing, described is a compact chassis assembly accommodating a substantial amount of dense circuitry in a small area. The precision machining of the various components, including the module cases and the guide rails of the chassis allow a precise positioning of the multiple socket contacts thereof with the corresponding pin contacts of the backplane. In view of the dense nature of the electrical contacts, and the relatively small dimensions thereof, accurate alignment is critical so as to prevent damage or bending of the pin contacts. Moreover, the compact design of the modules allow one side cover thereof to be easily removed for inspection or adjustment of the underlying circuit components, all without affecting the overall integrity of the module. Moreover, the size of each module case is generally about the size of a cigarette package, but nevertheless suitable for enclosing a small hard disk drive unit, or three circuit boards having dense circuits and components mounted thereto. In accordance with an important feature of the invention, each module can accommodate over 372 electrical connections thereto when employing three printed circuit boards, and over 600 pin-socket connections when employing five printed circuit boards.

From the foregoing, a much improved chassis assembly and module case have been disclosed, which structures overcome the shortcomings and disadvantages of the prior art. Further, disclosed is a technique for assembly of the structures. While the preferred embodiment of the invention has been disclosed with respect to a specific chassis and module case, it is to be understood that many changes in detail may be made as a matter of engineering choices, without departing from the spirit and scope of the invention, as defined by the appended claims.

What is claimed is:

1. A hard disk drive module accessible by a processor, comprising:

a modular hard disk drive having a plurality of electrical connections;

an insulator collector plate supporting a plurality of electrical contacts, said insulator collector plate being removeable from said plurality of contacts;

a printed circuit board having integrated circuits mounted thereto, said printed board being supported by said insulator collector plate, and being electrically connected to said plurality of electrical contacts and to said electrical connections;

said integrated circuits including latches for temporarily latching address, data and control signals for use by said hard disk drive, said latches controlled by said processor; and a protective cover housing said modular hard disk drive and said printed circuit board, and for supporting said insulator collector plate so that electrical connections can be made to the contacts as supported by said insulator collector plate.

2. The hard disk drive module of claim 1, wherein said insulator collector plate includes a plurality of holes, each hole for supporting a tubular-shaped said electrical contact.

3. The hard disk drive module of claim 1, wherein each said electrical contact is soldered to said printed circuit board, and further including a plurality of conductors connecting said printed circuit board to said electrical connections of said modular hard disk drive.

4. The hard disk drive module of claim 1, further including an electrical connector for connection to the electrical connections of said modular hard disk drive, and including a flexible multi-conductor cable connecting said electrical connector to said printed circuit board.

5. The hard disk drive module of claim 4, wherein said protective cover housing has a movable lid, and said hard disk drive is removable from said protective cover housing via said movable lid.

6. The hard disk drive module of claim 5, wherein said flexible multi-conductor cable is arranged so that said hard disk drive can be moved via said lid outside said protective cover housing while yet connected to said electrical connector and flexible multi-conductor cable.

7. The hard disk drive module of claim 5, wherein said movable lid is detachable from a body portion of said protective cover housing.

8. The hard disk drive module of claim 1, wherein said hard disk drive comprises a commercially available unit for insertion into said protective cover housing and electrically connected to said electrical contacts.

9. A hard disk drive module, comprising:

a four-sided module case having at least one side thereof that is movable, said module case having opposing end openings;

a faceplate located at one end opening of the module case and removably attached thereto;

a contact support plate located at another end opening of the module case and removably attached thereto;

a hard disk drive unit insertable into said module case, said hard disk drive unit having a plurality of contacts pins;

a printed circuit board having mounted thereto electrical components, and having electrical connections to said contact support plate, and said printed circuit board supported spatially by said contact support plate without being attached to said module case; and a connector electrically connected to said printed circuit board, said connector for connecting to the contact pins of said hard disk drive unit.

10. The hard disk drive unit of claim 9, further including a flexible multi-conductor cable interconnecting said connector to said printed circuit board.

11. The hard disk drive unit of claim 9, wherein said faceplate and said contact support plate are fixed to said module case by screws.

12. The hard disk drive unit of claim 11, wherein said screws are elongate and extend through said module case between said faceplate and said contact support plate.

13. A hard disk drive module, comprising:

a commercially available hard disk drive unit having a rotating storage medium protected by a cover, and including a set of electrical connections;

a portable module case separate from said hard disk drive unit, into which said hard disk drive unit is insertable;

a contact back plate removably attached to a back side of said portable module, and including a plurality of contacts for coupling electrical signals to said hard disk drive unit;

a plurality of flexible conductors coupling electrical signals between said hard disk drive unit and said contact back plate, said flexible conductors being arranged so as to allow said hard disk drive unit to be removed from said portable module case while remaining electrically connected to said contact back plate, and to allow said contact back plate to be removed from the back side of said portable module case while remaining electrically connected to said hard disk drive unit; and said hard disk drive module being of a size and construction so as to be removable from other computer equipment by a user of the computer equipment to provide security to data stored on the hard disk drive unit.

14. The hard disk drive module of claim 13, further including a printed circuit board, and electrical components mounted to said printed circuit board, said printed circuit board mounted to said contact back plate and carried with said contact back plate if said contact back plate is removed from said module case.

15. The hard disk drive module of claim 13, further including data latches electrically connected between the electrical connections of said hard disk drive unit and the contacts of the portable module backplate.

16. The hard disk drive module of claim 13, wherein the portable module is of a size to fit within a shirt pocket of the user.

* * * * *